(12) United States Patent
Riou

(10) Patent No.: US 9,711,432 B2
(45) Date of Patent: Jul. 18, 2017

(54) ELECTRONIC POWER DEVICE WITH IMPROVED COOLING

(71) Applicant: SAFRAN ELECTRONICS & DEFENSE, Boulogne Billancourt (FR)

(72) Inventor: Jean-Christophe Riou, Boulogne Billancourt (FR)

(73) Assignee: SAFRAN ELECTRONICS & DEFENSE, Boulogne Billancourt (FR)

( * ) Notice: Subject to any disclaimer, the term of this patent is extended or adjusted under 35 U.S.C. 154(b) by 0 days.

(21) Appl. No.: 15/110,026

(22) PCT Filed: Jan. 7, 2015

(86) PCT No.: PCT/EP2015/050157
§ 371 (c)(1),
(2) Date: Jul. 6, 2016

(87) PCT Pub. No.: WO2015/104285
PCT Pub. Date: Jul. 16, 2015

(65) Prior Publication Data
US 2016/0329266 A1   Nov. 10, 2016

(30) Foreign Application Priority Data
Jan. 7, 2014   (FR) ...................................... 14 50097

(51) Int. Cl.
*H01L 23/495* (2006.01)
*H01L 23/44* (2006.01)
(Continued)

(52) U.S. Cl.
CPC ............ *H01L 23/44* (2013.01); *B81B 7/0093* (2013.01); *H01L 23/06* (2013.01);
(Continued)

(58) Field of Classification Search
CPC ........... H05K 7/20218; H05K 7/20236; H05K 7/209; H05K 7/20909; H05K 7/20927;
(Continued)

(56) References Cited

U.S. PATENT DOCUMENTS

| 4,281,708 A * | 8/1981 | Wing | F28F 27/00 165/277 |
| 5,305,184 A * | 4/1994 | Andresen | H01L 23/44 165/104.33 |
| 2007/0267741 A1* | 11/2007 | Attlesey | G06F 1/20 257/714 |

FOREIGN PATENT DOCUMENTS

| EP | 0 534 440 A1 | 3/1993 | |
| WO | WO 2009048458 A1 * | 4/2009 | B01J 19/2485 |

* cited by examiner

*Primary Examiner* — Reema Patel
*Assistant Examiner* — Syed Gheyas
(74) *Attorney, Agent, or Firm* — Muncy, Geissler, Olds & Lowe, P.C.

(57) ABSTRACT

An electronic device comprising at least one electronic component mounted on a support and surrounded by a deformable casing containing a heat-conducting and electrically-insulating liquid, the device comprising a heat dissipation plate that is substantially parallel to the support and spaced apart therefrom, and heat exchange means for heat exchange by conduction between the casing and the plate, the heat-conducting and electrically-insulating liquid being selected and the casing being arranged so that thermal expansion of the oil leads to the casing applying force against the means for heat exchange by conduction.

14 Claims, 2 Drawing Sheets

(51) Int. Cl.
  *H05K 7/20* (2006.01)
  *H01L 23/00* (2006.01)
  *B81B 7/00* (2006.01)
  *H01L 23/06* (2006.01)
  *H01L 23/367* (2006.01)
  *H01L 23/373* (2006.01)
  *H01L 25/07* (2006.01)

(52) U.S. Cl.
  CPC ...... *H01L 23/3675* (2013.01); *H01L 23/3736* (2013.01); *H01L 23/49541* (2013.01); *H01L 23/49568* (2013.01); *H01L 24/48* (2013.01); *H01L 24/73* (2013.01); *H01L 25/074* (2013.01); *H05K 7/20236* (2013.01); *H05K 7/20927* (2013.01); *B81B 2201/01* (2013.01); *H01L 2224/48091* (2013.01); *H01L 2224/48106* (2013.01); *H01L 2224/48247* (2013.01); *H01L 2224/73265* (2013.01); *H01L 2924/0002* (2013.01); *H01L 2924/00014* (2013.01); *H01L 2924/01013* (2013.01); *H01L 2924/01022* (2013.01); *H01L 2924/01026* (2013.01); *H01L 2924/01028* (2013.01); *H01L 2924/01029* (2013.01); *H01L 2924/01047* (2013.01); *H01L 2924/01049* (2013.01); *H01L 2924/1033* (2013.01); *H01L 2924/10272* (2013.01); *H01L 2924/13055* (2013.01); *H01L 2924/13062* (2013.01); *H01L 2924/13091* (2013.01); *H01L 2924/1461* (2013.01); *H01L 2924/19107* (2013.01)

(58) Field of Classification Search
  CPC ..... H05K 7/20272; H01L 23/42; H01L 23/44; H01L 23/473; H01L 23/433
  See application file for complete search history.

ELECTRONIC POWER DEVICE WITH IMPROVED COOLING

BACKGROUND OF THE INVENTION

Field of the Invention

The present invention relates to an electronic device and more particularly to an electronic device subjected to power currents.

Brief Discussion of the Related Art

Such a device generally comprises power electronics components that are fastened on a ceramic support and connected via cables to conductors serving to connect the electronic device electrically to the elements to which it is designed to be connected.

By way of example, it is known to use that type of device to power the phases of an electrical motor. In that application, the components are switches connected by diodes to the phases of the motor.

The ceramic substrate is fastened on a heat dissipation plate, or support surface, for cooling the components.

However, the heat given off by the components is transmitted to the heat dissipation plate by the ceramic substrate only in its zone that underlies each component. Thus, heat transfer is relatively limited, such that the temperature of the device in operation is quite high, which makes it necessary to space the components apart from one another to promote cooling.

That results in the device being relatively large in size.

It also results in the power that the components can transmit being limited in order to limit their rise in temperature.

BRIEF SUMMARY OF THE INVENTION

An object of the invention is to provide means that make it possible to cool such electronic devices, in particular in such a manner as to be able to increase the power density of such modules.

To this end, the invention provides an electronic device comprising at least one electronic component mounted on a support and surrounded by a deformable casing containing a heat-conducting and electrically-insulating liquid. The device comprises a heat dissipation plate that is substantially parallel to the support and spaced apart therefrom, and means for heat exchange by conduction between the casing and the plate. The heat-conducting and electrically-insulating liquid is selected and the casing is arranged so that thermal expansion of the oil leads to the casing applying force against the means for heat exchange by conduction.

The heat produced during operation of the component is exhausted to the heat dissipation plate mainly by the heat-conducting and electrically-insulating liquid (such as a silicone oil), the casing, and the means for heat exchange by conduction. Since the liquid is in direct contact with the component, the transfer of heat to the liquid and then to the casing and the means for heat exchange by conduction is enhanced, the heat-conductive liquid presenting a greater surface area for heat exchange between the component and the cold zone. As a result, cooling of the component is relatively effective. Furthermore, heating the liquid causes it to expand in such a manner that the liquid exerts pressure on the casing, which pressure reinforces contact between the casing and the means for heat exchange by conduction, thus further improving the effectiveness of heat transfer.

Preferably, the heat exchange means comprise heat conducting studs that extend over the heat dissipation plate and that have free ends for making contact with the casing, which ends are spaced apart from one another.

The deformability of the casing enables it to fit around the shape of the free ends of the studs at least in part, increasing the surface area for heat exchange therewith.

Advantageously, the studs are arranged to have the casing press against them as a result of thermal expansion of the heat-conducting and electrically-insulating liquid.

This flattening increases the heat exchange surface area between the free end of the studs and the casing.

These studs may be made of non-deformable or deformable materials, of silver, or indium, or even of shape-memory materials (alloy of iron and titanium for example). A shape-memory alloy is an alloy having several specific properties:

- the ability to return to an initial shape after deformation resulting merely from applying heat;
- the possibility of alternating between two already "memorized" shapes when its temperature varies around a critical temperature. The material takes on one of the shapes below the critical temperature and another shape above it;
- super-elastic behavior that enables elongation (10%) without plastic deformation that is greater than that of other metals (a few percent);
- the "rubber-like" effect (when the alloy in self-accommodated martensitic form is subjected to deformation it conserves residual deformation on being released; if the material is stressed and then unloaded once more, this residual deformation increases); and
- the damping effect, since the alloy is capable of damping impacts or attenuating mechanical vibration (its super-elasticity or even the elasticity of its martensitic phase presenting a hysteresis phenomenon that leads to energy dissipation).

The shape-memory material used could thus be deformed during integration of the module and could be chosen for having a critical temperature for returning to its initial position that is consistent with the operating temperatures of the module. Thus, the material always remains in the same position, bearing continuously and elastically against the casing and the support surface during operation. During a cold restart, the shape-memory material deforms towards the other position, thus disconnecting itself from the casing and effectively thermally insulating the module from the support surface. Thus, this process makes it possible to greatly accelerate the time required for a cold restart of the power module, which power module heats up, as does the surrounding atmosphere, and enables contact to be made with the studs made of shape-memory material.

In a particular embodiment, the support comprises an electrical conductor of the busbar type, the device comprising means for compensating differential expansion between the conductor and the component and, preferably, the compensation means comprise a segment of the conductor that extends in the vicinity of the component and that is of reduced thickness.

The support thus also ensures an electrical connection function while absorbing differential expansion. Furthermore, this makes it possible to simplify the structure of the device since the connections and the components are on a common substrate (namely, the busbar). The connection clips may be made of copper, possibly tempered, or of shape-memory material. For shape-memory materials, the material is selected to implement either the super-elastic characteristic or the "rubber-like" effect characteristic, these characteristics enabling it to withstand very large amounts of thermal expansion, compared to conventional materials (non-tempered copper, iron, nickel . . . ) with improved ageing in passive thermal cycling or in power cycling.

Other characteristics and advantages of the invention appear on reading the following description of particular non-limiting embodiments of the invention.

BRIEF DESCRIPTION OF THE DRAWINGS

Reference is made to the accompanying drawings, in which.

DETAILED DISCUSSION OF THE PREFERRED EMBODIMENTS

Below, the electronic device is described in application to powering an electric motor.

Figure 1:
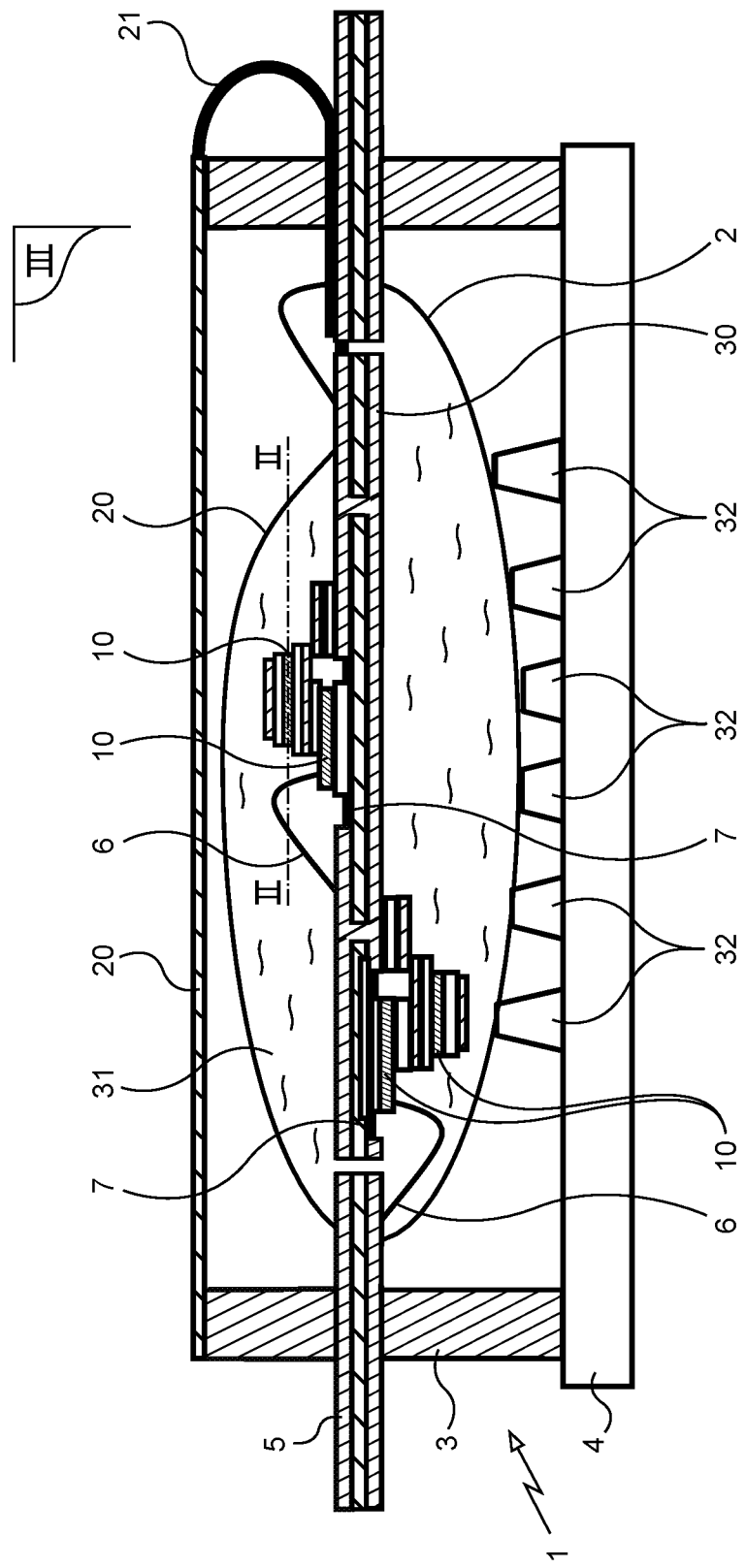
FIG. 1 is a diagrammatic view in cross-section of a device of the invention.

With reference to FIG. 1, the electronic device includes a support, having the overall reference 1, for power electronics components, i.e. switches 10, and a control card 20.

The support 1 comprises a rigid electrical conductor in the form of a busbar 2 passing through a frame 3 having one edge that is secured to a heat dissipation plate 4 or support surface and an opposite edge on which the control card 20 is fastened.

The control card 20 is of the surface mounted component (SMC or "Chip on board") type and is connected to the busbar 2 by flexible conductors 21.

The busbar 2 has one end 5 projecting sideways from the frame 3 forming power input/output means. In this embodiment, the busbar 2 comprises at least two layers of conductor track separated by a layer of insulation.

In this embodiment, the switches 10 are junction switches of the insulated gate bipolar transistor (IGBT), metal oxide semiconductor field effect transistor (MOSFET), silicon carbide (SiC) MOSFET, junction field effect transistor (JFET), or gallium nitride (GaN) transistor type. There are four switches 10 and they are mounted in pairs on top of each other on respective ones of the two faces of the busbar 2. Each switch 10 is electrically connected to the busbar 2 either by soldering portions of the switch 10 directly to the busbar 2 or by conductive wires 6 with their ends soldered respectively to the busbar 2 and to the switch 10. The switches 10 are connected to one another in parallel or low-side/high-side in order to form branches of a control bridge for the motor. The switches 10 of each pair are controlled to conduct in alternation. In known manner, it is necessary to connect each switch to a freewheel diode in order to evacuate the return current coming from the load when the switch 10 is open.

The busbar 2 comprises segments 7 that extend in the vicinity of the pairs of switches 10 and that are of reduced thickness. The segments 7 form zones of relative flexibility acting as means for compensating differential expansion between the busbar 2 and the switches 10 in such a manner as to reduce assembly stresses.

Each pair of switches 10 is surrounded by a deformable casing 30 containing a heat-conducting and electrically-insulating liquid 31. The deformable casing is made of metal and in particular of a nickel alloy such as those produced under the trademark "Inconel" from the supplier Special Metals Corporation, and in this embodiment it is of thickness lying in the range 10 micrometers (μm) to 100 μm. The heat-conducting and electrically-insulating liquid 31 is a silicone oil.

The device comprises means for heat exchange by conduction between the casing 30 and the heat dissipation plate 4. The casing 30 is arranged so that, below a predetermined temperature, the casing 30 is not in contact with the means for heat exchange by conduction.

The means for heat exchange by conduction comprise heat conducting studs 32 that extend over the heat dissipation plate 4 and that have free ends spaced apart from one another in order to make contact with the casing 30. More precisely in this example, the studs 32 widen going towards the heat dissipation plate 4: in this example, they are of frustoconical shape, but they could be in the shape of truncated pyramids.

The studs 32 are made of silver and they are arranged to have the casing 30 press against them as a result of thermal expansion of the heat-conducting and electrically-insulating liquid 31.

It should be understood that when the temperature of the switches increases, the temperature of the liquid 31 rises, so the liquid expands and deforms the membrane 30 pressing it against the studs 32 in order to ensure transfer of heat by conduction to the heat dissipation plate 4. If the temperature increases further, the stress exerted by the casing 30 on the studs 32 due to the expansion of the liquid 31 is sufficient to deform the studs 32.

This results in better conduction due to the contact force and due to the increase in the contact area.

It should be observed that the arrangement of the heat exchange means makes it possible to mount power components on both faces of the busbar 2. It is therefore possible to mount twice as many power components in the module of the invention.

By maintaining a mean operating temperature that is relatively low, the heat exchange means also make it possible to mount the switches 10 in pairs on top of each other (stacking). This stacking principle associated with the controlling the switches in alternation not only makes it possible to save space, as mentioned above, but also to reduce the temperature variations to which each switch is subjected during the active power cycles: each of the switches in its conductive state, and therefore giving off heat, maintains the mean temperature of the pair of switches while the other switch is in its closed state. Limiting thermal cycles improves the lifetime of the switches.

Naturally, the invention is not limited to the embodiments described but encompasses any variant coming within the ambit of the invention as defined by the claims.

In particular, the components may have a structure that is different from that described.

Figure 2:
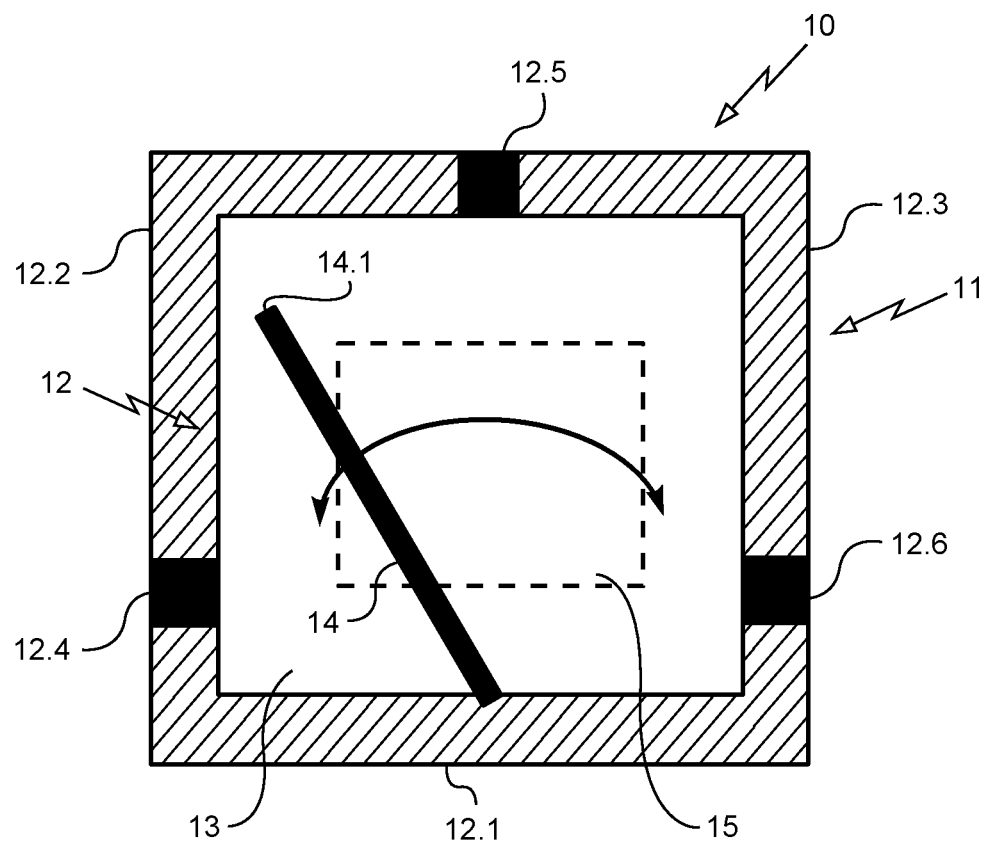
FIG. 2 is a diagrammatic view, in cross-section on a line II-II of FIG. 1, of one of the components of said device constituting an advantageous variant embodiment of the invention.
Figure 3:
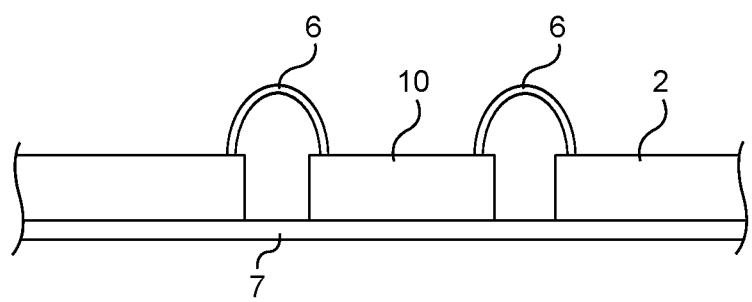
FIG. 3 is a view of a detail in section along the plane III of FIG. 1 of means for compensating differential expansion.

In an advantageous variant of the invention, and with reference to FIG. 2, each switch 10 is an electronic switch of the micro-electromechanical system (MEMS) type having a package, given overall reference 11, having a side wall 12 of closed outline extending between two plates 13 in order to define an evacuated enclosure. The side wall 12 is divided into three connection portions 12.1, 12.2, 12.3, which are electrically conductive and insulated from one another by electrically insulating portions 12.4, 12.5, 12.6. The connection portion 12.1 is connected to the motor, the connection portion 12.2 is connected to a source of positive potential and the connection portion 12.3 is connected to a source of negative potential. An electrically-conductive contact element 14, (e.g. having an outer coating of nickel/ gold), extends from the first connection portion 12.1 so that its free end 14.1 is movable between a first position in which the free end 14.1 is in contact with the second connection portion 12.2 in order to establish an electrical connection between the two connection portions, and a second position in which the free end 14.1 is not in contact with the second connection portion 12.2. The free end 14.1 is movable between the second position and a third position in which the free end 14.1 is in contact with the third connection position 12.3 in order to establish an electrical connection between said two connection portions. The second position thus extends between the first position and the third position. The contact element 14 is arranged to be movable between its two positions under the effect of a field established between the two plates 13, i.e. a field normal to the plane shown in FIG. 2. Each plate 13 is provided with an electrode connected to a potential source via the control circuit in such a manner that an electric field may be established between the plates 13. Such switches have a switching time that is very short compared with the reaction time of the motor. Thus, the return pulse sent by the motor to the first connection portion 12.1 during switching does not have time to pass into the connection portion 12.2, 12.3 that is being disconnected, but is directed into the connection portion 12.3, 12.2 that is being connected. It is therefore not necessary to provide freewheel diodes to block said return pulse. The evacuated enclosure makes it possible to avoid an electric arc forming during switching.

Also advantageously, the switches 10 of FIG. 2 may be arranged in the form of a set of switches arranged in a matrix and connected to a matrix control circuit in which there pass control signals giving rise to fields in the switches. Said set of switches thus preferably comprises a layer of polysilicon covered with insulation on which the switches are placed and means for charging the layer of polysilicon in order to form a capacitor. The capacitor enables the field to be maintained during unintentional interruption of the control signal.

The studs may comprise at least one of the following materials: silver, indium, copper, nickel, iron, titanium, aluminum. Both the studs and the casing are made of materials with little sensitivity to creep and oxidation in such a manner that heat transfer performance is preserved over the estimated lifetime of the device.

The heat-conducting and electrically-insulating liquid comprises at least one of the following components: a silicone oil, a fluoropolyether such as that currently sold by the supplier Solvay under the trademarks Galden and Fomblin.

In a simplified version, the casing of the module may also exchange heat directly with an external heat transfer fluid without passing via a heat interface.

The invention claimed is:

1. An electronic device comprising at least one electronic component mounted on a support and surrounded by a deformable casing containing a heat-conducting and electrically-insulating liquid, the device comprising a heat dissipation plate that is substantially parallel to the support and spaced apart therefrom, and heat exchange means for heat exchange by conduction between the casing and the plate, the heat-conducting and electrically-insulating liquid being selected and the casing being arranged so that thermal expansion of the liquid leads to the casing applying force against the means for heat exchange by conduction, the casing being arranged so that, below a predetermined temperature, the casing is not in contact with the means for heat exchange by conduction.

2. The device according to claim 1, wherein the heat exchange means comprise heat conducting studs that extend over the heat dissipation plate and that have free ends for making contact with the casing, which ends are spaced apart from one another.

3. The device according to claim 2, wherein the studs are arranged to have the casing press thereagainst as a result of thermal expansion of the heat-conducting and electrically-insulating liquid.

4. The device according to claim 3, wherein the studs may comprise at least one of the following materials: silver, indium, copper, nickel, iron, titanium, aluminum.

5. The device according to claim 2, wherein the studs widen going towards the heat dissipation plate and/or the studs are made of a shape-memory material in such a manner as to press the stud elastically between the casing and the plate in a predetermined range of operating temperatures.

6. The device according to claim 1, wherein the support comprises an electrical conductor of the busbar type, the device comprising means for compensating differential expansion between the conductor and the component.

7. The device according to claim 1, wherein the compensation means comprise a segment of the conductor that extends in the vicinity of the component and that is of reduced thickness.

8. The device according to claim 1, wherein the heat-conducting and electrically-insulating liquid comprises at least one of the following components: a silicone oil, a fluoropolyether.

9. The device according to claim 1, comprising two power electronics components designed to conduct in alternation, both components being superposed on the same side of the support.

10. The device according to claim 1, comprising at least two electronic components each placed on one side of the support.

11. The device according to claim 1, wherein the casing is made of nickel alloy such as that produced under the trademark "inconel".

12. The device according to claim 11, wherein the casing has a thickness lying in the range 10 μm and 100 μm.

13. The device according to claim 1, wherein the component is an electronic switch of the MEMS type having a housing having a side wall of closed outline extending between two plates in order to define an evacuated enclosure, the side wall comprising a first connection portion and at least one second connection portion that are electrically conductive and insulated from one another, a contact element extending from the first connection portion so that its free end is movable between a first position in which the free end is in contact with the second connection portion and a second position in which the free end is not in contact with the second connection portion, the contact element being arranged to be movable between its two positions under the effect of a field established between the two plates.

14. The device according to claim 13, wherein the side wall of the switch comprises a connection portion and the contact element is arranged to have its free end movable between the first connection position and a third position in which the free end is in contact with the third connection portion, the second position being located between the first and third positions and the free end in the disconnection position being not in contact with the second connection portion and the third connection portion.

\* \* \* \* \*